(12) United States Patent
Bhatia

(10) Patent No.: US 7,342,787 B1
(45) Date of Patent: Mar. 11, 2008

(54) INTEGRATED CIRCUIT COOLING APPARATUS AND METHOD

(75) Inventor: Rakesh Bhatia, Austin, TX (US)

(73) Assignee: Sun Microsystems, Inc., Santa Clara, CA (US)

( * ) Notice: Subject to any disclaimer, the term of this patent is extended or adjusted under 35 U.S.C. 154(b) by 308 days.

(21) Appl. No.: 10/941,115

(22) Filed: Sep. 15, 2004

(51) Int. Cl.
H05K 7/20 (2006.01)

(52) U.S. Cl. .................. 361/700; 62/3.2; 165/104.33; 165/80.2; 165/185; 361/704; 361/710; 361/715

(58) Field of Classification Search .................. None
See application file for complete search history.

(56) References Cited

U.S. PATENT DOCUMENTS

| | | | |
|---|---|---|---|
| 5,032,897 | A | 7/1991 | Mansuria et al. |
| 5,195,102 | A | 3/1993 | McLean et al. |
| 5,220,171 | A | 6/1993 | Hara et al. |
| 5,724,818 | A | 3/1998 | Iwata et al. |
| 5,918,469 | A | 7/1999 | Cardella |
| 5,921,087 | A | 7/1999 | Bhatia et al. |
| 5,960,866 | A | 10/1999 | Kimura et al. |
| 6,094,919 | A | 8/2000 | Bhatia et al. |
| 6,233,959 | B1 | 5/2001 | Kang et al. |
| 6,233,960 | B1 | 5/2001 | Kang et al. |
| 6,250,085 | B1 | 6/2001 | Tousson |
| 6,338,251 | B1 * | 1/2002 | Ghoshal ................ 62/3.2 |
| 6,424,533 | B1 | 7/2002 | Chu et al. |
| 6,453,678 | B1 | 9/2002 | Sundhar |
| 6,463,743 | B1 | 10/2002 | Laliberté |
| 6,559,538 | B1 | 5/2003 | Pomerene et al. |
| 6,581,388 | B2 | 6/2003 | Novotny et al. |
| 6,645,786 | B2 | 11/2003 | Pomerene et al. |
| 6,658,861 | B1 | 12/2003 | Ghoshal et al. |
| 6,708,501 | B1 | 3/2004 | Ghoshal et al. |
| 6,711,904 | B1 | 3/2004 | Law et al. |

(Continued)

FOREIGN PATENT DOCUMENTS

JP    1995407202094    2/1997

OTHER PUBLICATIONS

"TEC Integrated Heat Sinks", Enẽrtron Custom Design & Manufacturing of Thermal Management Systems: Enẽrtron, Inc., Mesa, AZ., 2002.

(Continued)

Primary Examiner—Gregory D Thompson
(74) Attorney, Agent, or Firm—Meyertons Hood Kivlin Kowert & Goetzel, P.C.; B. Noël Kivlin

(57) ABSTRACT

In various embodiments, heat from a computer component may be absorbed into a medium, moved to a remote heat dispersal unit and dissipated into the surrounding air. In some embodiments, the heat dispersal unit may include a heat sink. In some embodiments, the medium may include a liquid metal. In various embodiments, a vapor compression system may include an evaporator, a compressor, a condenser, and an expansion valve. In some embodiments a separate heat pipe may be placed between the computer component and the evaporator. In various embodiments, a thermo conductive plate may be used to thermally couple the heat pipe to various components including the computer component, evaporator, condenser, and/or heat sink. In some embodiments, a thermo electric module (TEM) may be coupled to various parts of the system.

19 Claims, 10 Drawing Sheets

U.S. PATENT DOCUMENTS

| | | | |
|---|---|---|---|
| 6,743,972 | B2 | 6/2004 | Macris |
| 6,917,522 | B1 * | 7/2005 | Erturk et al. ............... 361/700 |
| 7,002,801 | B2 * | 2/2006 | Zeighami et al. ........... 361/700 |
| 2003/0085024 | A1 * | 5/2003 | Santiago et al. ....... 165/104.11 |
| 2004/0182088 | A1 | 9/2004 | Ghoshal et al. |
| 2004/0234379 | A1 | 11/2004 | Miner et al. |
| 2004/0234392 | A1 | 11/2004 | Ghoshal et al. |
| 2005/0150535 | A1 | 7/2005 | Samavedam et al. |
| 2005/0150536 | A1 | 7/2005 | Ngai et al. |
| 2005/0150537 | A1 | 7/2005 | Ghoshal |
| 2005/0150539 | A1 | 7/2005 | Ghoshal et al. |
| 2005/0160752 | A1 | 7/2005 | Ghoshal et al. |
| 2005/0189089 | A1 | 9/2005 | Miner |

OTHER PUBLICATIONS

"Laser Module Cooling, Design Goals and Constraints", *Enẽrtron Total Thermal Management Solutions*: Enẽrtron, Inc., Mesa, AZ., 2002.

"Heat pipes for electronics cooling applications", by Scott D. Garner, PE. *Electronics Cooling*, Thermacore Inc., Lancaster, PA., 2001.

"SubZero4G™ Thermo-Electric Cooling", *Thermaltake SubZero4G Thermo-Electric Cooling*: Thermaltake Technology Co., Ltd., City of Industry, CA., 2003.

"The Cooling Electrokinetic Pump"; http://web.archive.org/web/20040630060103/www.cooligy.com/electrokinetic_pump.html, dated Jul. 25, 2004.

"Advanced Microchannel Cooling Loop"; http://web.archive.org/web/20040725041209/www.cooligy.com/micro_channel_cooling.html, dated Jul. 25, 2004.

"Microchannel Cooling"; http://web.archive.org/web/20040619033221/www.cooligy.com/microchannels.html, dated Jul. 25, 2004.

* cited by examiner

INTEGRATED CIRCUIT COOLING APPARATUS AND METHOD

BACKGROUND OF THE INVENTION

1. Field of the Invention

The present invention relates generally to cooling and, more specifically, to cooling integrated circuits.

2. Description of the Related Art

Microprocessors have dramatically increased in speed, however, that increase in speed has led to increased cooling problems. Microprocessors and other integrated circuits need to be cooled to prevent excessive heat build-up and eventual hardware failure. One solution is to place a heat sink, made of a conductive metal, in thermal contact with the microprocessor. Heat from the microprocessor is conducted to the heat sink and dispersed into the surrounding air. Fans may also be used to move air over the heat sinks to further enhance their cooling rate. Heat sinks may also include fins to increase the surface area of the heat sink in contact with the air to further enhance cooling.

However, as microprocessor speeds increase, the heat sink required to disperse their generated heat may be very large. This may make thin computers (e.g., laptops) hard or impossible to design. Additional problems have also been encountered in the quest for smaller computers. For example, because microprocessors have become smaller, there is less surface area on the microprocessor for thermal contact with a heat sink. In addition, the smaller enclosures of thinner computing devices may restrict airflow over the heat sink.

SUMMARY OF THE INVENTION

In various embodiments, heat from a computer component (such as an integrated circuit) may be absorbed into a medium, moved to a remote heat dispersal unit and dissipated into the surrounding air. In some embodiments, the heat dispersal unit may include a heat sink. In some embodiments, the medium may include a liquid metal.

In various embodiments, a vapor compression system may be used to remove heat. The vapor compression system may include an evaporator (coupled to the computer component), a compressor, a condenser (in the heat dispersal unit), and an expansion valve. A medium in the evaporator may absorb heat from the computer component, be compressed in the compressor, and cooled in the condenser. The greater pressure of the condenser may drive the medium through the expansion valve to the lower pressure evaporator side, and the process may repeat. In some embodiments a separate heat pipe may be placed between the computer component and the evaporator. In various embodiments, a thermo conductive plate may be used to thermally couple the heat pipe to various components including the computer component, evaporator, condenser, and/or heat sink.

In some embodiments, a thermo electric module (TEM) may be coupled to various parts of the system. For example, a TEM may be coupled between the computer component and the evaporator or between the condenser and the heat sink. Other placements of the TEMs are also contemplated. In some embodiments, a thermo conductive plate may be used to thermally couple a heat pipe to a TEM.

Figure 1A:
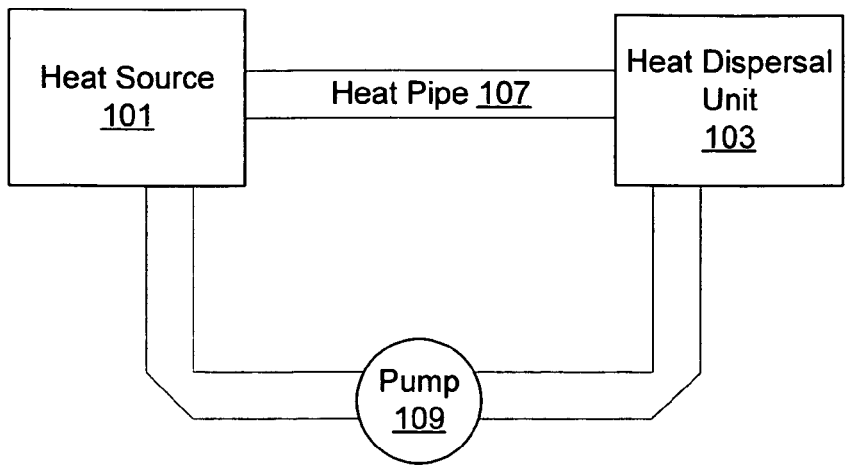
FIGS. 1a, 1b, 1c, 1d, 1e, and 1f illustrate various embodiments for removing heat from a heat source.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents, and alternatives falling within the spirit and scope of the present invention as defined by the appended claims. Note, the headings are for organizational purposes only and are not meant to be used to limit or interpret the description or claims. Furthermore, note that the word "may" is used throughout this application in a permissive sense (i.e., having the potential to, being able to), not a mandatory sense (i.e., must). The term "include", and derivations thereof, mean "including, but not limited to". The term "coupled" means "directly or indirectly connected".

DETAILED DESCRIPTION

FIGS. 1a, 1b, 1c, 1d, 1e, and 1f illustrate an embodiment for removing heat from a heat source 101. In some embodiments, the heat source 101 may include an integrated circuit (IC) 105 (e.g., see FIG. 1c) such as a microprocessor. Other heat sources are also contemplated. For example, the heat source 101 may be a power supply or other heat generating component inside a computer system. In some embodiments, e.g., with a microprocessor or other IC, the heat source 101 may be inside of a case 113 (e.g., see FIG. 1c).

Figure 1B:
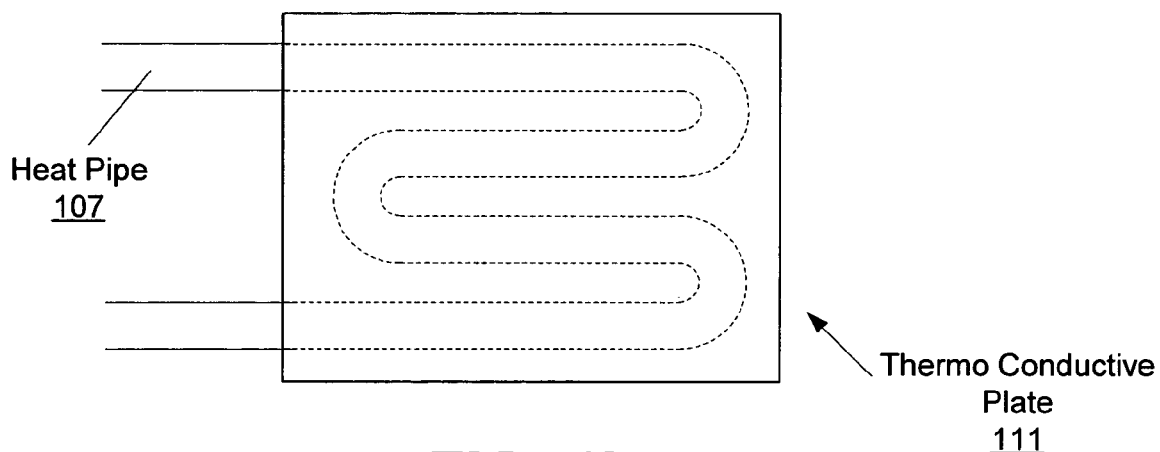
Figure 1C:
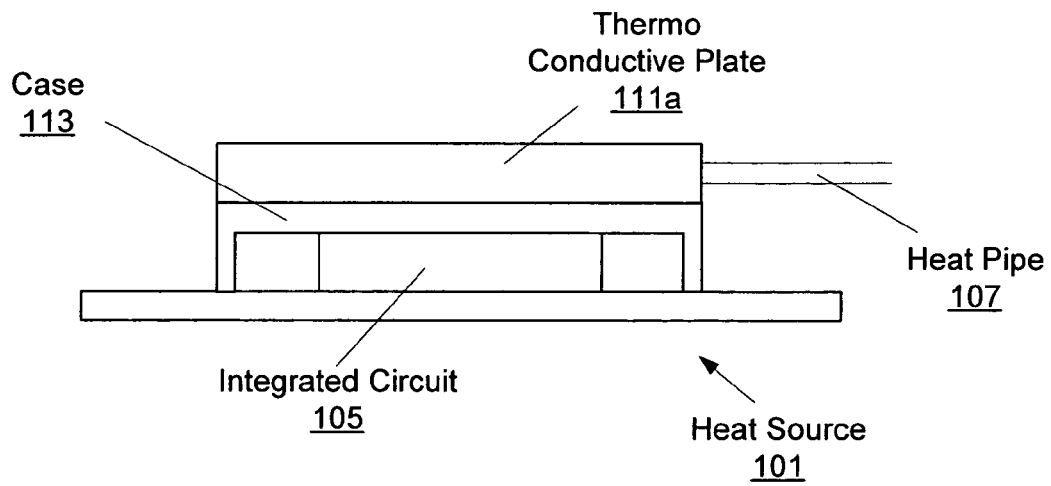
Figure 1D:
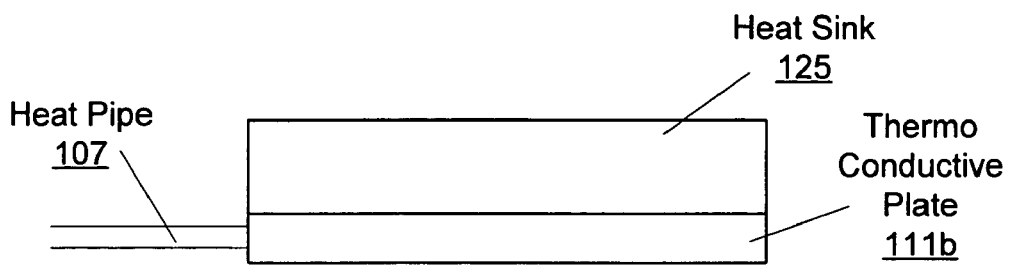

In some embodiments, heat from the heat source 101 may be absorbed into a medium inside a heat pipe 107. To facilitate heat transfer, a thermo conductive plate 111a, made of a conductive material such as aluminum, may couple the heat pipe 107 to the case 113. Other materials for the thermo conductive plate 111 may be used. A top profile of the thermo conductive plate 111 and heat pipe 107 is shown in FIG. 1b. In some embodiments, the thermo conductive plate 111a may form part of the case 113 (e.g., the top). In some embodiments, the heat pipe 107 may be coupled to the IC 105 without a thermo conductive plate 111a. In some embodiments, a pump 109 may move the medium through the heat pipe 107 between the heat source 101 and a heat dispersal unit 103. The medium may include a heat absorbing liquid (e.g., water). In some embodiments, the medium may be a liquid metal (e.g., mercury). Liquid metals may absorb heat quicker and hold more heat than other mediums. In some embodiments, the heat dispersal unit 103 may include a thermo conductive plate 111b (see FIG. 1d) to facilitate heat conduction from the medium in the heat pipe 107 to the heat sink 125. The heat may be dispersed by the heat sink 125 into the surrounding air.

Figure 1E:
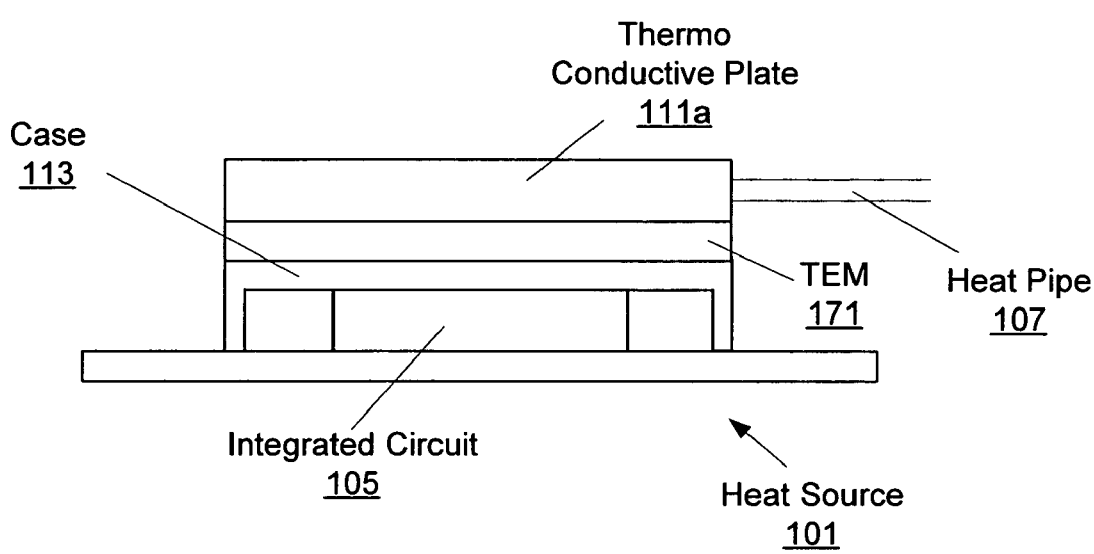
Figure 1F:
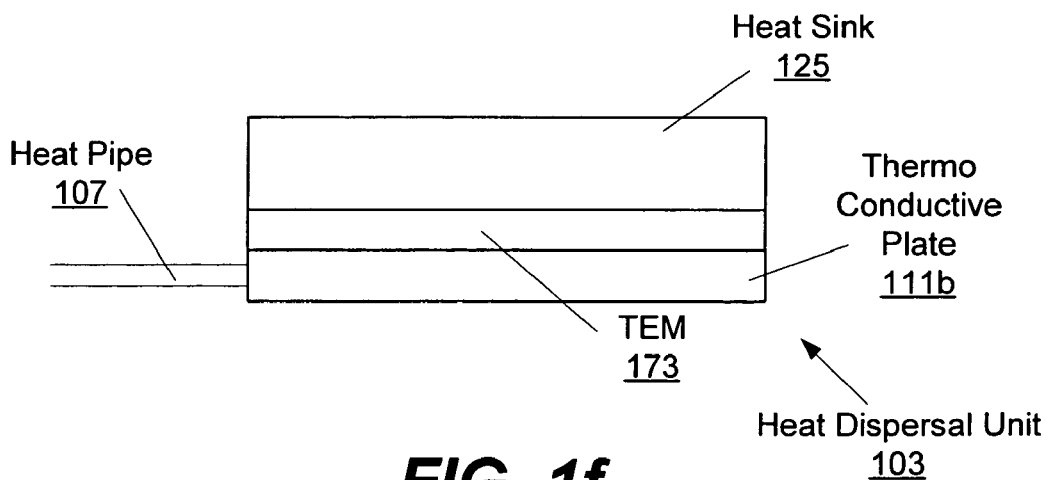

FIGS. 1e and 1f illustrate additional embodiments with incorporated thermoelectric modules (TEMs). In some embodiments, thermoelectric modules (TEMs) (e.g., TEMs 171 and 173) may be used to increase cooling. TEMs, which may include P-type and N-type semiconductors arranged in series between two plates, take advantage of the Peltier effect (current traveling through a junction between two different types of conductors results in a cool side and a hot side of the junction). The TEMs 171 and 173 may have a cool side (e.g., a bottom plate) and a warm side (e.g., a top plate). As seen in FIG. 1e, in some embodiments, a cool side of the TEM 171 may be coupled to the IC 105 or case 113. In some embodiments, the warm side of the TEM 171 may be coupled to the thermo conductive plate 111a. As seen in FIG. 1f, in some embodiments, a cool side of the TEM 173 may be coupled to the thermo conductive plate 111b. In some embodiments, the warm side of the TEM 173 may be coupled to the heat sink 125.

Figure 2A:
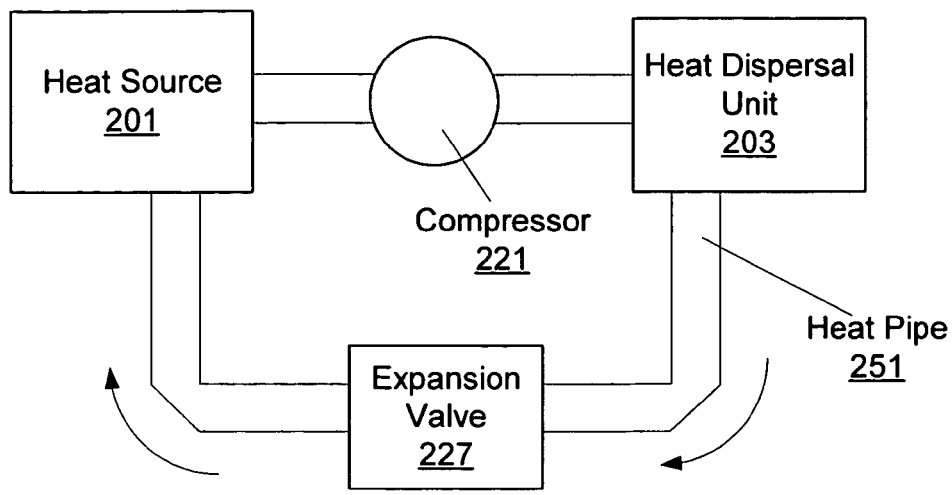
FIGS. 2a, 2b, and 2c illustrate an embodiment of a vapor compression system for removing heat from a heat source.
Figure 2B:
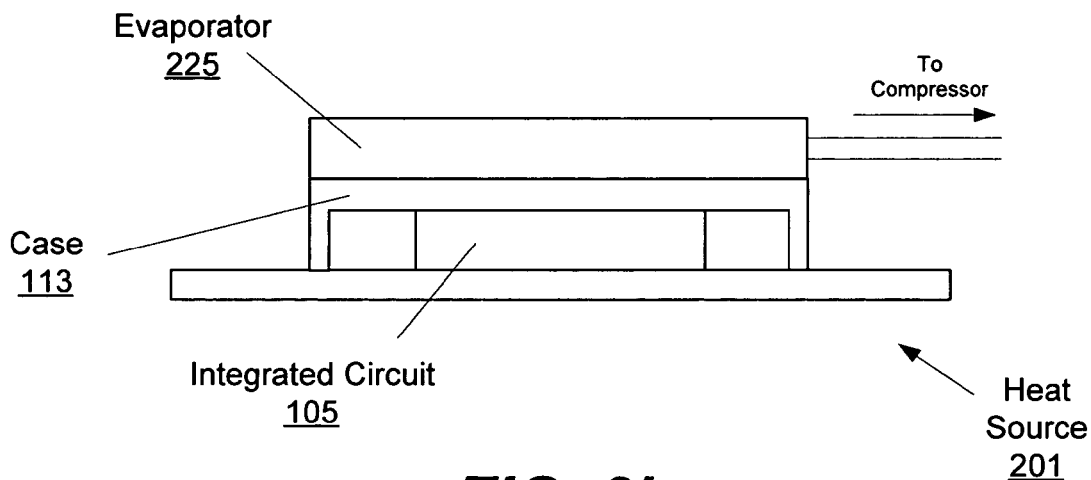
Figure 2C:
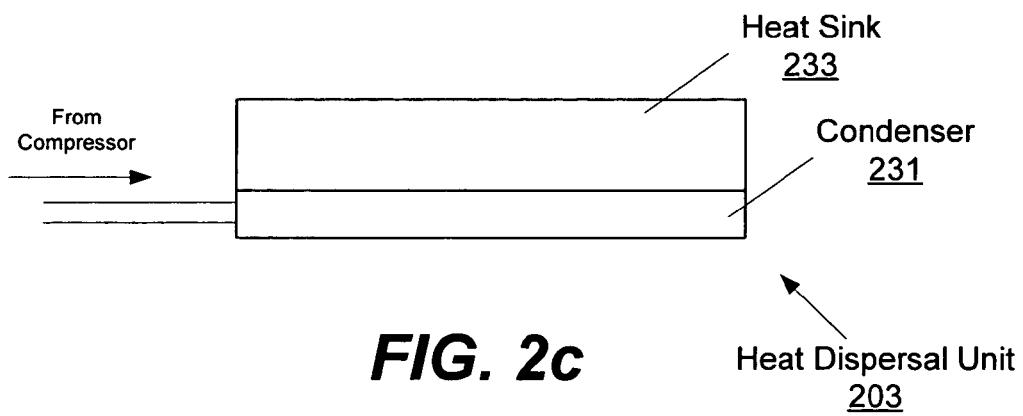

FIGS. 2a, 2b, and 2c illustrate an embodiment of a vapor compression system for removing heat from a heat source 201. In some embodiments, the vapor compression system may include a compressor 221, an evaporator 225 (see FIG. 2b), a condenser 231 (see FIG. 2c), and an expansion valve 227. A vapor compression medium may travel through heat pipe 251 between the different components. For example, the vapor compression medium may be a refrigerant such as R22, R410A, R407c, R134A, R404A, R507A, $NH_3$, HC, or $CO_2$. Other vapor compression mediums may also be used.

In some embodiments, the vapor compression medium may evaporate in the evaporator 225 as it absorbs heat from, for example, the integrated circuit 105 (see FIG. 2b). The evaporated vapor compression medium may then be compressed in the compressor 221. When the vapor compression medium leaves the compressor 221, it may be a liquid. In some embodiments, the vapor compression medium may then travel through the condenser 231 where it may cool (see FIG. 2c). Heat from the vapor compression medium may be dissipated into the surrounding air (e.g., through a heat sink 233 coupled to the condenser 231). The cooled vapor compression medium may then travel through the expansion valve 227 (which may separate the high pressure condenser side from the low pressure evaporator side). In the evaporator 225, the cooled vapor compression medium may then absorb heat (e.g., from the integrated circuit 105). The cycle may then repeat.

In some embodiments, because the heat dispersal unit 203 (which may include, for example, the condenser 231 and heat sink 233) may be located remote from the heat source 201, the heat dispersal unit 203 may be more efficient at dissipating heat. For example, the temperature differentials between the remote heat sink 233 and the surrounding air may be greater (and hence more efficient at dissipating heat) than if the heat dispersal unit 203 was located on the heat source 201. The additional energy added to the system by the compressor 221 may also increase the temperature differential. Furthermore, because the heat dispersal unit 203 may be located remotely from the heat source 201, the heat dispersal unit 203 may be located closer to the edge of a computer enclosure (e.g., closer to a vent and, therefore, closer to cooler room air). In some embodiments, because the heat dispersal unit 203 may be located remote from the heat source 201, the heat dispersal unit 203 may be arranged relative to fans, etc, in the computer enclosure without having to move, for example, the integrated circuit 105.

Figure 3A:
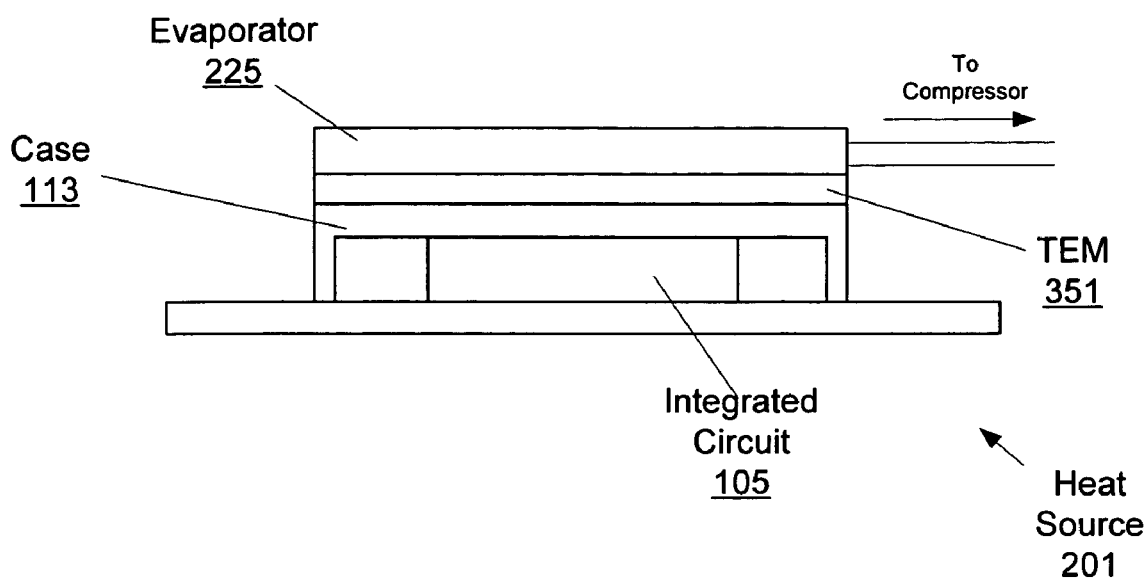
FIGS. 3a and 3b illustrate additional embodiments with incorporated thermal electric modules (TEMs).
Figure 3B:
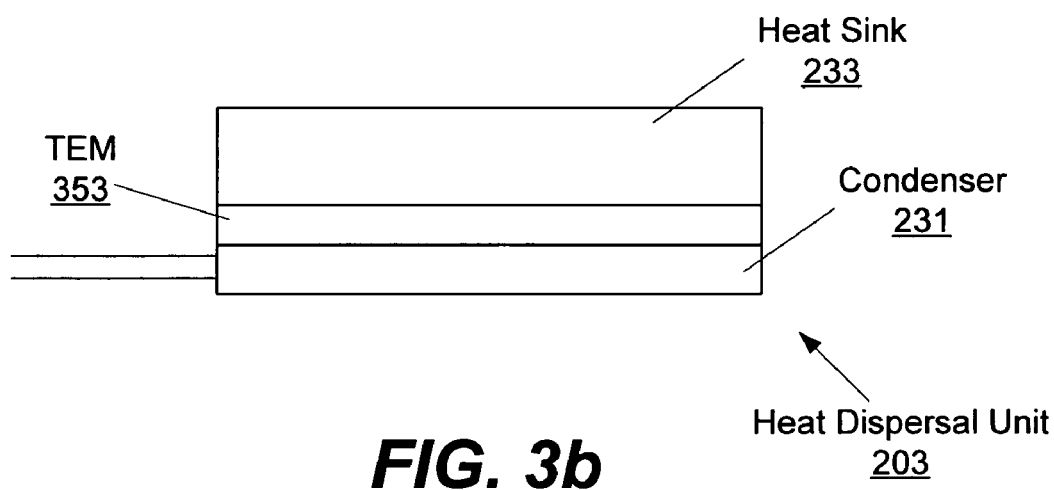

FIGS. 3a and 3b illustrate additional embodiments with incorporated TEMs. In some embodiments, a bottom plate (the cool side) of TEM 351 may be in thermal contact with, for example, the integrated circuit 105. In some embodiments, the TEM 351 may be in thermal contact with the case 113 and/or may form part of the case 113 (e.g., the TEM 351 may be built into the top of the case 113). The top plate (the warm side) of the TEM 351 may be in thermal contact with the evaporator 225. As seen in FIG. 3b, the bottom plate (cool side) may be in thermal contact with the condenser 231 and the top plate (warm side) of the TEM 353 may be in thermal contact with the heat sink 233. In some embodiments, a TEM may be used on only the heat source 201 side. In some embodiments, a TEM may be used on only the heat dispersal unit 203 side. In some embodiments, a TEM may be used on both the heat source 201 side and the heat dispersal unit 203 side.

FIGS. 4a, 4b, 4c, and 4d illustrate embodiments of remote vapor compression systems. In some embodiments, a medium, e.g., a liquid metal, may be pumped (by pump 109) through heat pipe 107 between a heat source 405 and a heat dispersal unit 403. In some embodiments, the evaporator 225 may be remotely located from the heat source 405. For example, the evaporator 225 may absorb heat from a thermo conductive plate 403 in which the medium from the heat pipe 107 may flow through to dissipate heat. The vapor compression medium may travel through heat pipe 451 and be compressed in compressor 221, cooled in condenser 231 (aided by heat sink 233), before traveling through an expansion valve 227 to arrive back at the evaporator 225. In some embodiments, the evaporator 225 may thus be located remote from the heat source 405. The condenser 231 may be further located remote from the evaporator 225.

Figure 4A:
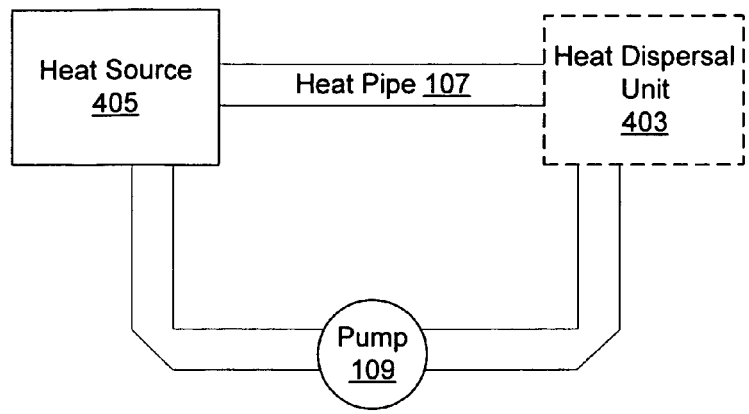
FIGS. 4a, 4b, 4c, and 4d illustrate embodiments of remote vapor compression systems.
Figure 4B:
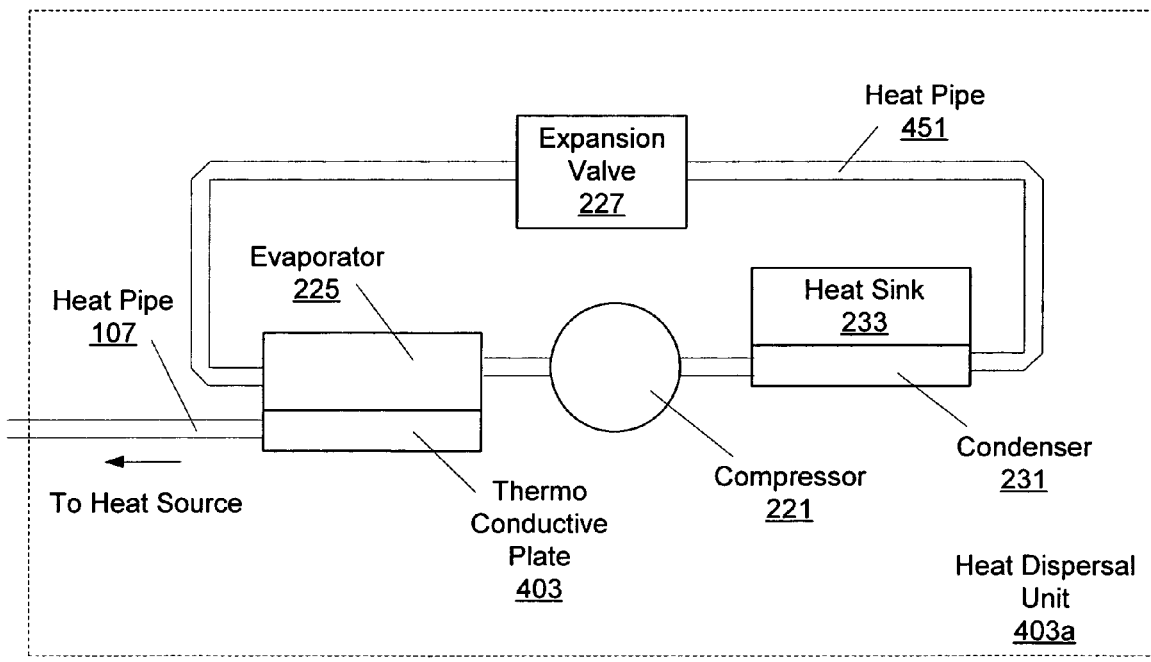
Figure 4C:
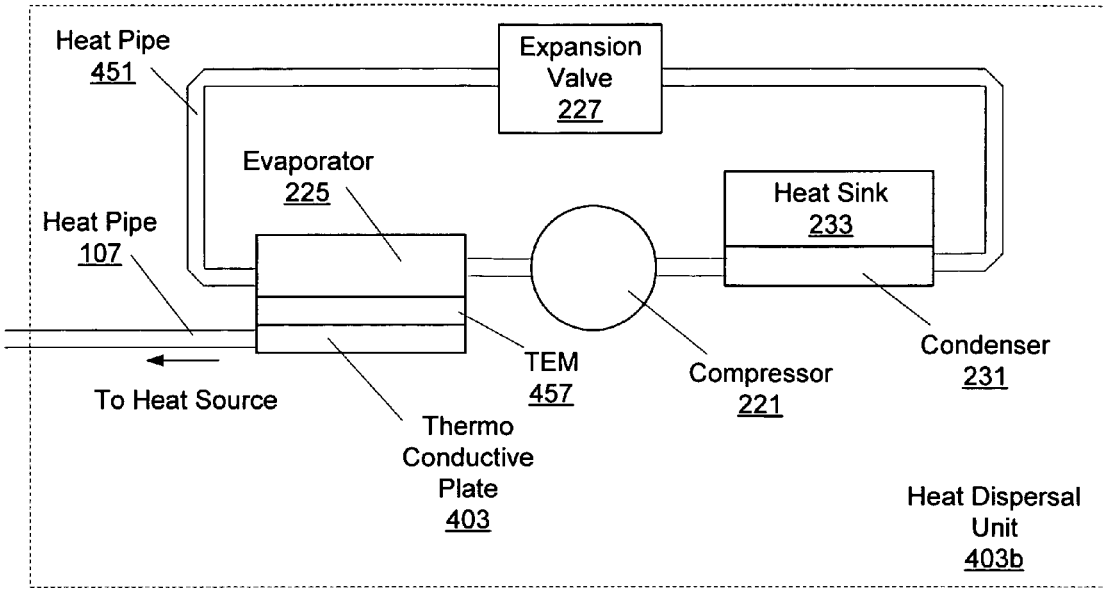
Figure 4D:
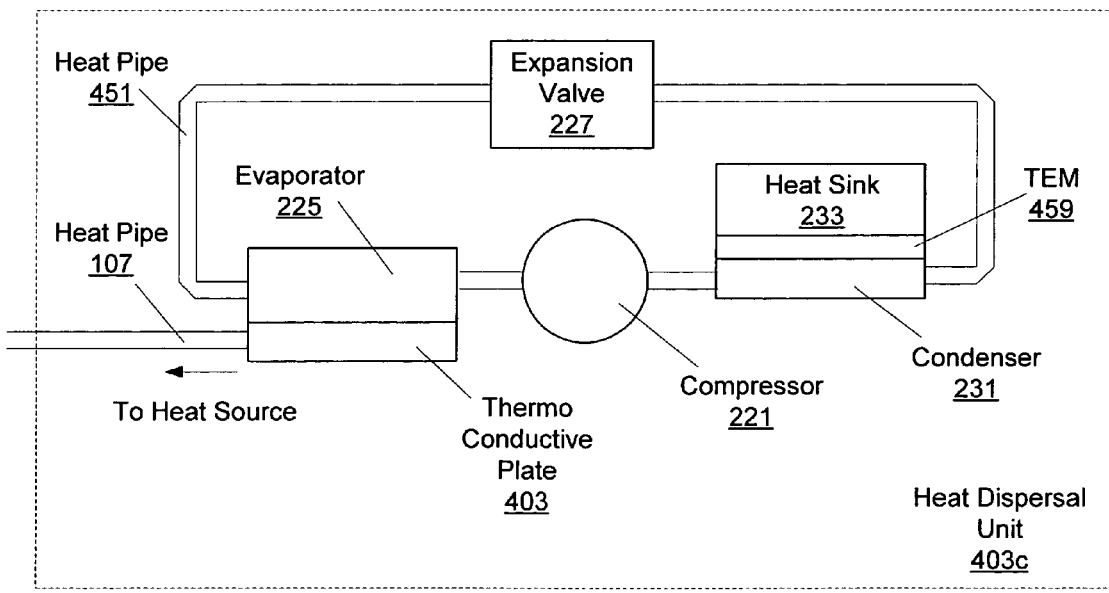

In some embodiments, as seen in FIGS. 4c and 4d, a TEM (e.g., TEM 457 and/or TEM 459) may be used. In some embodiments, a TEM 457 may be used between a thermo conductive plate 403 and the evaporator 225 (e.g., the cool side of the TEM 457 may be in thermal contact with the thermo conductive plate 403 and the warm side of the TEM 457 may be in thermal contact with the evaporator 225). In some embodiments, a TEM 459 may be used between the condenser 231 and the heat sink 233 (e.g., the cool side of the TEM 459 may be in thermal contact with the condenser 231 and the warm side of the TEM 459 may be in thermal contact with the heat sink 233). In some embodiments, either or both of the TEMs 457 and 459 may be used. In some embodiments, neither may be used.

Figure 5:
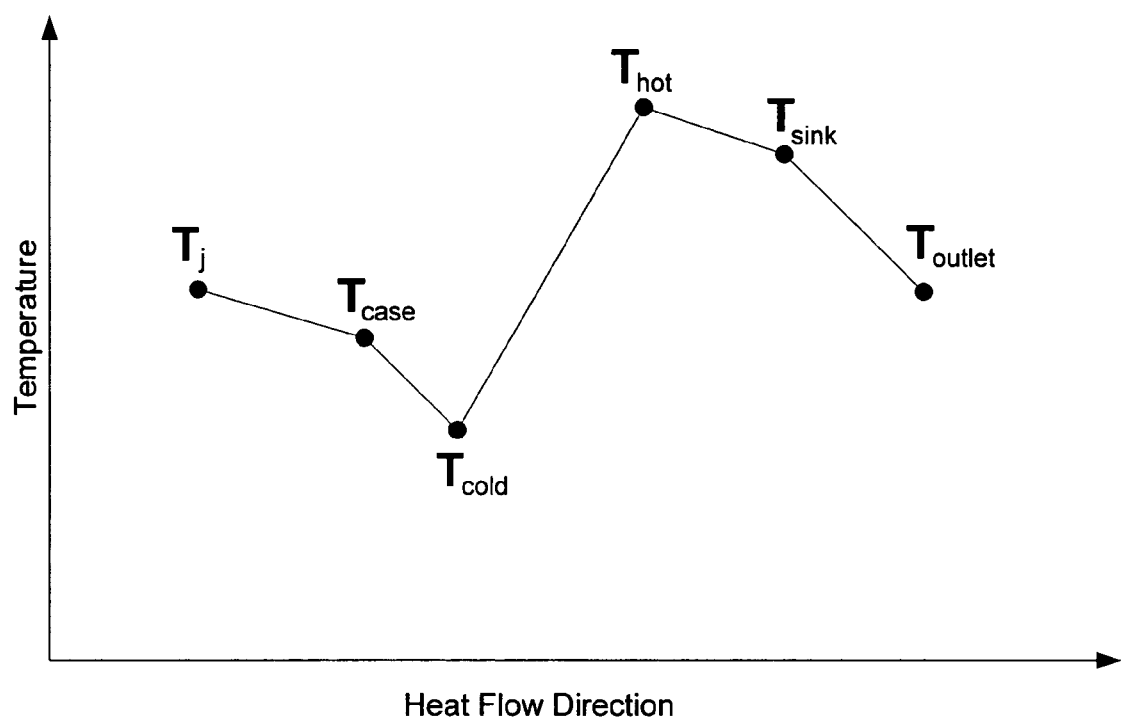
FIG. 5 illustrates an embodiment of a temperature versus heat flow direction.

FIG. 5 illustrates an embodiment of a temperature versus heat flow direction. In some embodiments, a $T_{cold}$ (Temperature$_{cold}$) may be achieved at the cool side (e.g., the evaporator or the cool side of a TEM) with a $T_{hot}$ at the warm side (e.g., the condenser or the warm side of the TEM). The $T_{cold}$ may be lower than achievable with a simple heat sink thermally coupled to the heat source (at $T_j$). Furthermore, because the $T_{hot}$ is typically much higher than the ambient air, heat transfer to the air may be more efficient (than, for example, heat transfer between a heat sink coupled directly to the heat source and the surrounding air). A heat sink coupled to the source of $T_{hot}$ may be at $T_{sink}$ and dissipate more heat to the ambient air (at $T_{outlet}$) than if the heat sink were at a cooler temperature. The differential between $T_{cold}$ and $T_{hot}$ may be achieved by adding energy to the system. For example, energy may be put into the system through the compressor of the vapor compression system and/or through the TEM.

Figure 6:
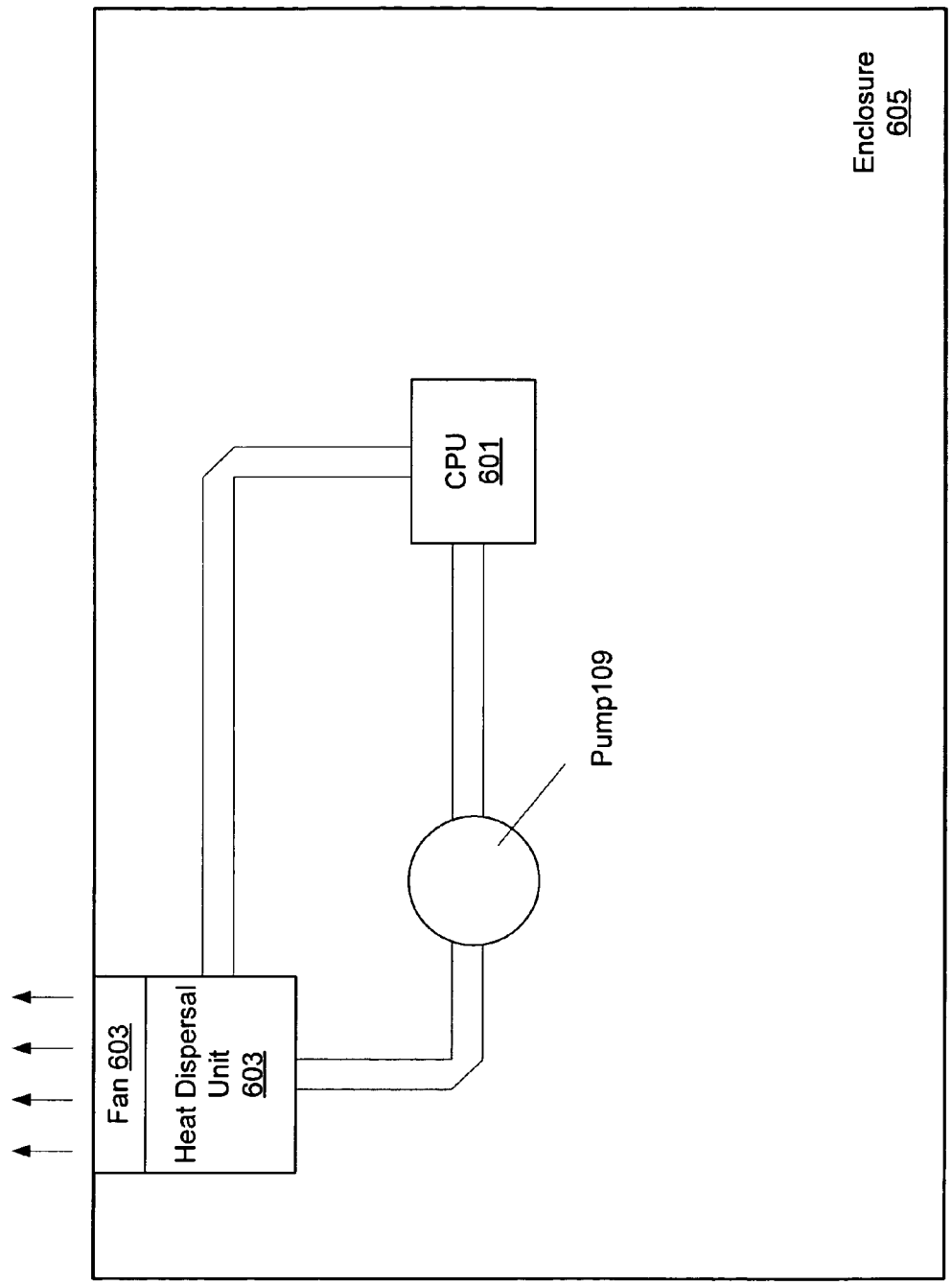
FIG. 6 illustrates an embodiment of a CPU and heat dispersal arrangement.
Figure 7:
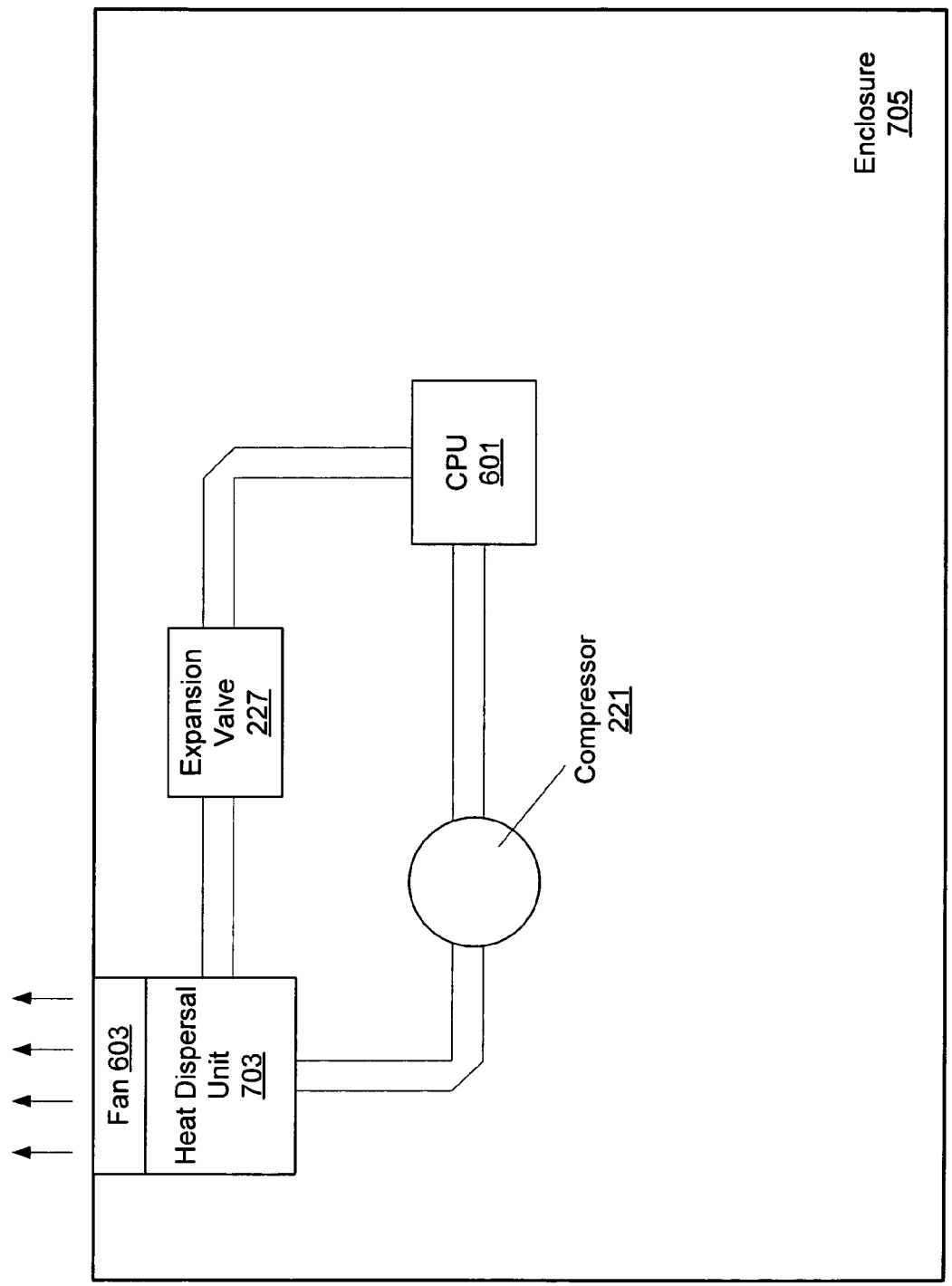
FIG. 7 illustrates another embodiment of a CPU and heat dispersal arrangement.

FIG. 6 illustrates an embodiment of a central processing unit (CPU) and heat dispersal unit arrangement. In some embodiments, a CPU 601 inside of a computer enclosure 605 may be cooled via a heat dispersal unit 603 (e.g., heat dispersal unit 103 or 403 as described above). FIG. 7 illustrates another embodiment of a CPU and heat dispersal arrangement. In some embodiments, the CPU 601 may be cooled via a heat dispersal unit (e.g., heat dispersal unit 203 or 403). For example, the CPU may be thermally coupled to an evaporator and/or TEM.

Figure 8:
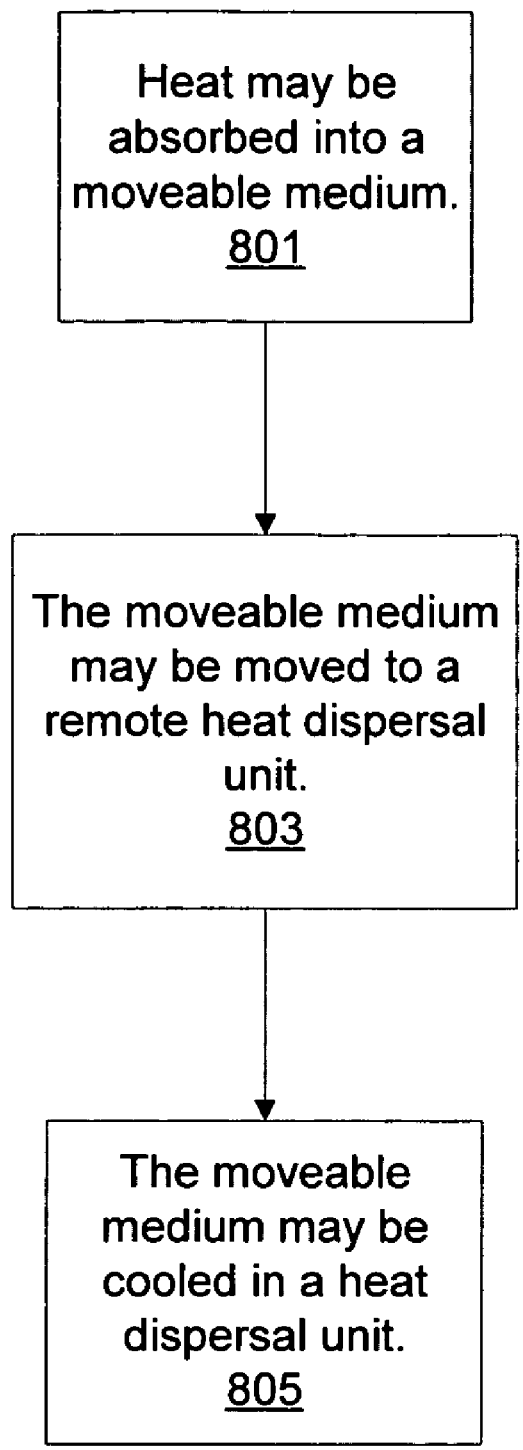
FIG. 8 illustrates an embodiment of a method for cooling an integrated circuit.

FIG. 8 illustrates an embodiment of a method for cooling an integrated circuit. It should be noted that in various embodiments of the methods described below, one or more of the elements described may be performed concurrently, in a different order than shown, or may be omitted entirely. Other additional elements may also be performed as desired.

At 801, heat may be absorbed into a moveable medium. In some embodiments, the moveable medium may be a liquid metal. In some embodiments, the moveable medium may be a vapor compression medium. In some embodiments, the vapor compression medium may absorb the heat through an evaporator.

At 803, the moveable medium may be moved to a remote heat dispersal unit. In some embodiments, the moveable medium may be pumped using a pump. In some embodiments, if the moveable medium is a vapor compression medium, a compressor may be used to move the moveable medium. For example, the vapor compression medium from the evaporator may be compressed in the compressor.

At 805, the moveable medium may be cooled in a heat dispersal unit. In some embodiments, the moveable medium may move through a thermo conductive plate 403 coupled to a heat sink, TEM, and/or an evaporator. In some embodiments, if the moveable medium is a vapor compression medium, the vapor compression medium may move into a condenser to cool. In some embodiments, a heat sink and/or a TEM may also be coupled to the condenser.

Further modifications and alternative embodiments of various aspects of the invention may be apparent to those skilled in the art in view of this description. Accordingly, this description is to be construed as illustrative only and is for the purpose of teaching those skilled in the art the general manner of carrying out the invention. It is to be understood that the forms of the invention shown and described herein are to be taken as embodiments. Elements and materials may be substituted for those illustrated and described herein, parts and processes may be reversed, and certain features of the invention may be utilized independently, all as would be apparent to one skilled in the art after having the benefit of this description of the invention. Changes may be made in the elements described herein without departing from the spirit and scope of the invention as described in the following claims.

What is claimed is:

1. An apparatus for cooling a computer component, comprising:
   a vapor compression system (VCS), comprising:
      an evaporator coupled to the computer component;
      a condenser coupled to the evaporator;
      a compressor coupled to the evaporator and the condenser; and
      a thermoelectric module (TEM) comprising a warm side and a cool side;
   wherein the cool side of the TEM is connected to the condenser; and
      wherein the cool side of the TEM is operable to absorb heat from the condenser.

2. The apparatus of claim 1, further comprising a heat sink, wherein the warm side of the TEM is connected to the heat sink.

3. The apparatus of claim 1, wherein the TEM is a first TEM, and wherein the apparatus further comprises a second TEM coupled to the computer component and to the evaporator, wherein the cool side of the second TEM is connected to the computer component and the warm side of the second TEM is connected to the evaporator.

4. The apparatus of claim 3, wherein second TEM is embedded in a case securing the computer component.

5. The apparatus of claim 3, wherein the condenser is located along an edge of a computer enclosure and wherein the computer component is not located along the edge of the computer enclosure.

6. The apparatus of claim 3, wherein heat from the computer component is operable to flow from the computer component to the second TEM, then from the second TEM to the evaporator, then from the evaporator to the condenser through a moveable medium, then from the condenser to the first TEM, and then from the first TEM to a heat sink.

7. The apparatus of claim 1, wherein the computer component is an integrated circuit.

8. The apparatus of claim 1, wherein the cool side of the TEM is directly connected to the condenser.

9. An apparatus, comprising:
   a computer component;
   a vapor compression system (VCS), comprising:
      an evaporator coupled to the computer component;
      a condenser coupled to the evaporator;
      a compressor coupled to the evaporator and the condenser;
   a heat sink;
   a first thermoelectric module (TEM) comprising a warm side and a cool side, wherein the cool side of the first TEM is connected to the condenser and the warm side of the first TEM is connected to the heat sink, and wherein the cool side of the first TEM is operable to absorb heat from the condenser; and
   a second thermoelectric module (TEM) comprising a warm side and a cool side, wherein the cool side of the second TEM is coupled to the computer component and the warm side of the second TEM is connected to the evaporator.

10. The apparatus of claim 9, wherein second TEM is embedded in a case securing the computer component.

11. The apparatus of claim 9, wherein the condenser is located along an edge of a computer enclosure and wherein the computer component is not located along the edge of the computer enclosure.

12. The apparatus of claim 9, wherein heat from the computer component is operable to flow from the computer component to the second TEM, then from the second TEM to the evaporator, then from the evaporator to the condenser through a moveable medium, then from the condenser to the first TEM, and then from the first TEM to the heat sink.

13. The apparatus of claim 9, wherein the computer component is an integrated circuit.

14. The apparatus of claim 9, wherein the cool side of the first TEM is directly connected to the condenser.

15. The apparatus of claim 9, wherein the warm side of the first TEM is directly connected to the heat sink.

16. A method, comprising:
   absorbing heat from a computer component into a moveable medium through an evaporator coupled to the computer component;
   moving the moveable medium to a heat dispersal unit;
   cooling the moveable medium in a condenser of the heat dispersal unit; and
   absorbing the heat from the condenser to a thermoelectric module (TEM) connected to the condenser; and wherein the TEM is a first TEM and absorbing heat from the computer component comprises absorbing heat from the computer component to a second TEM coupled to the computer component, wherein the moveable medium absorbs the heat from the second TEM through the evaporator.

17. The method of claim 16, further comprising absorbing heat from the first TEM to a heat sink connected to the first TEM.

18. The method of claim 16, wherein the heat dispersal unit is located along an edge of a computer enclosure and wherein the computer component is not located along the edge of the computer enclosure.

19. The apparatus of claim 16, wherein the computer component is an integrated circuit.

* * * * *